US009241403B2

(12) United States Patent
Pares

(10) Patent No.: US 9,241,403 B2
(45) Date of Patent: Jan. 19, 2016

(54) METHOD FOR PRODUCING A STRUCTURE FOR MICROELECTRONIC DEVICE ASSEMBLY

(71) Applicant: COMMISSARIAT A L'ENERGIE ATOMIQUE ET AUX ENE ALT, Paris (FR)

(72) Inventor: Gabriel Pares, Bernin (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/090,321

(22) Filed: Nov. 26, 2013

(65) Prior Publication Data

US 2014/0144690 A1    May 29, 2014

(30) Foreign Application Priority Data

Nov. 29, 2012 (FR) ..................... 12 61391

(51) Int. Cl.
*H05K 1/02* (2006.01)
*H05K 3/40* (2006.01)
(Continued)

(52) U.S. Cl.
CPC ............ *H05K 1/0296* (2013.01); *H01L 21/563* (2013.01); *H01L 23/3171* (2013.01);
(Continued)

(58) Field of Classification Search
CPC ..... H05L 1/0296; H05L 3/4084; H05L 3/467; H01L 24/73; H01L 24/92; H01L 23/3171; H01L 21/563; H01L 24/03; H01L 24/05; H01L 23/13; H01L 24/16; H01L 24/81; H01L 25/067; H01L 25/50; H01L 2224/3201; H01L 2224/73103; H01L 2224/73204; H01L 2224/81007; H01L 2224/83862; H01L 2224/9211; H01L 23/49811; H01L 2224/16245

USPC ......... 257/779, 737, 734, 738, 778, 777, 685, 257/686, 723; 438/734, 735, 736, 737, 738, 438/774, 779, 780, 778, 723, 686, 685; 174/261; 216/17
See application file for complete search history.

(56) References Cited

U.S. PATENT DOCUMENTS 6,578,755 B1    6/2003 Elenius et al.
7,291,548 B2    11/2007 Suh et al.
(Continued)

FOREIGN PATENT DOCUMENTS

JP    3-101233    4/1991
JP    03101233 A * 4/1991
(Continued)

OTHER PUBLICATIONS

Search Report dated Jul. 10, 2014 in corresponding EP Patent Application 2013 0194581 filed Nov. 27, 2013.
(Continued)

*Primary Examiner* — Alexander Oscar Williams
(74) *Attorney, Agent, or Firm* — Oblon, McClelland, Maier & Neustadt, L.L.P.

(57) ABSTRACT

Forming of a microelectronic device including a substrate containing at least one conductive pad, the pad being provided with a bottom surface resting on the substrate and an upper surface opposite the bottom surface. The upper surface of the pad has a stack applied thereto formed of a conductive layer and a protective dielectric layer including an opening called first opening facing the pad and exposing the conductive layer. At least one insulating block is arranged on a peripheral region of the upper surface of the pad, the insulating block having a cross-section forming a closed contour and having an opening called second opening. A conductive pillar is located in the center of the contour in the second opening.

9 Claims, 9 Drawing Sheets

(51) Int. Cl.
  *H05K 3/46* (2006.01)
  *H01L 23/31* (2006.01)
  *H01L 21/56* (2006.01)
  *H01L 23/00* (2006.01)
  *H01L 25/065* (2006.01)
  *H01L 25/00* (2006.01)
  *H01L 23/498* (2006.01)

(52) U.S. Cl.
  CPC .............. *H01L24/03* (2013.01); *H01L 24/05* (2013.01); *H01L 24/13* (2013.01); *H01L 24/16* (2013.01); *H01L 24/73* (2013.01); *H01L 24/81* (2013.01); *H01L 24/92* (2013.01); *H01L 25/0657* (2013.01); *H01L 25/50* (2013.01); *H05K 3/4084* (2013.01); *H05K 3/467* (2013.01); *H01L 23/49811* (2013.01); *H01L 24/11* (2013.01); *H01L 2224/0215* (2013.01); *H01L 2224/02123* (2013.01); *H01L 2224/02141* (2013.01); *H01L 2224/02166* (2013.01); *H01L 2224/036* (2013.01); *H01L 2224/0345* (2013.01); *H01L 2224/0348* (2013.01); *H01L 2224/0381* (2013.01); *H01L 2224/0391* (2013.01); *H01L 2224/03462* (2013.01); *H01L 2224/03464* (2013.01); *H01L 2224/0401* (2013.01); *H01L 2224/05083* (2013.01); *H01L 2224/05147* (2013.01); *H01L 2224/05155* (2013.01); *H01L 2224/05166* (2013.01); *H01L 2224/05187* (2013.01); *H01L 2224/05557* (2013.01); *H01L 2224/05559* (2013.01); *H01L 2224/05567* (2013.01); *H01L 2224/05568* (2013.01); *H01L 2224/05584* (2013.01); *H01L 2224/05644* (2013.01); *H01L 2224/10126* (2013.01); *H01L 2224/10135* (2013.01); *H01L 2224/1148* (2013.01); *H01L 2224/1181* (2013.01); *H01L 2224/11462* (2013.01); *H01L 2224/11464* (2013.01); *H01L 2224/13006* (2013.01); *H01L 2224/13022* (2013.01); *H01L 2224/13082* (2013.01); *H01L 2224/13084* (2013.01); *H01L 2224/13111* (2013.01); *H01L 2224/13116* (2013.01); *H01L 2224/13144* (2013.01); *H01L 2224/13147* (2013.01); *H01L 2224/13155* (2013.01); *H01L 2224/13166* (2013.01); *H01L 2224/16111* (2013.01); *H01L 2224/16148* (2013.01); *H01L 2224/16225* (2013.01); *H01L 2224/16227* (2013.01); *H01L 2224/16245* (2013.01); *H01L 2224/3201* (2013.01); *H01L 2224/73103* (2013.01); *H01L 2224/73204* (2013.01); *H01L 2224/81007* (2013.01); *H01L 2224/81011* (2013.01); *H01L 2224/8114* (2013.01); *H01L 2224/81139* (2013.01); *H01L 2224/81191* (2013.01); *H01L 2224/81193* (2013.01); *H01L 2224/81815* (2013.01); *H01L 2224/83102* (2013.01); *H01L 2224/83862* (2013.01); *H01L 2224/9211* (2013.01); *H01L 2225/06513* (2013.01); *H01L 2225/06593* (2013.01); *H01L 2924/00014* (2013.01)

(56) References Cited

U.S. PATENT DOCUMENTS

| | | | |
|---|---|---|---|
| 7,473,998 | B2 | 1/2009 | Tsai |
| 8,138,426 | B2 | 3/2012 | Matsuno et al. |
| 2009/0289360 | A1 | 11/2009 | Takahashi et al. |
| 2011/0143535 | A1* | 6/2011 | Pares ............................ 438/661 |
| 2011/0215476 | A1 | 9/2011 | Lee et al. |
| 2011/0298123 | A1 | 12/2011 | Hwang et al. |
| 2012/0146212 | A1 | 6/2012 | Daubenspeck et al. |
| 2015/0044866 | A1 | 2/2015 | Bouvier et al. |

FOREIGN PATENT DOCUMENTS

| | | |
|---|---|---|
| JP | 11-340277 A | 12/1999 |
| JP | 2002-093835 A | 3/2002 |
| JP | 2005-072202 A | 3/2005 |
| JP | 2005-079379 A | 3/2005 |
| WO | WO 2011/105961 A1 | 9/2011 |

OTHER PUBLICATIONS

Moffat, T. P, et al., "Curvature Enhanced Adsorbate Coverage Model for Electrodeposition," *Journal of the Electrochemical Society*, 153 (2) C127-C132 (2006).

Ghulghazaryan, R., et al., "Physics Based Full-Chip Scale Modeling of Copper Electrochemical Deposition," *Armenian Journal of Physics*, vol. 1, pp. 169-173 (2008).

French Partial Preliminary Search Report issued Jul. 31, 2013, in French Application No. 12 61391 filed Nov. 29, 2012 (with English Translation of Categories of Cited Documents).

* cited by examiner

METHOD FOR PRODUCING A STRUCTURE FOR MICROELECTRONIC DEVICE ASSEMBLY

TECHNICAL FIELD

The invention concerns the field of microelectronics and the assembly and interconnecting of microelectronic devices such as boards, substrates, chip carriers, chips, components.

It provides a method to produce a structure for assembling microelectronic devices, allowing the facilitated positioning of said devices relative to one another whilst obtaining good isolation of the conductive elements allowing the interconnecting of these devices and good mechanical strength.

PRIOR ART

It is increasingly being sought to produce vertical stacks of chips or components.

To connect together the bottom surface and top surface of a chip it is known to form connections called Through Silicon Vias (TSVs) which pass through the thickness of a substrate from which the chip is formed.

To connect and assemble chips together, connecting elements in the form of micro-pillars or micro-bumps can be used. Assembly is then achieved by joining micro-pillars or micro-bumps for example of one chip or component onto the micro-pillars or micro-bumps of another chip or component, solder material ensuring the joining of the chips.

With the two aforementioned types of electrical connections, different joining configurations can be used.

According to a first configuration, commonly called <<F2F>> or <<flip chip>>, the chips are assembled so that their active sides face one another.

According to a second configuration commonly called <<B2F>> or <<F2B>>, assembly is performed so that their two active sides are oriented in the same direction.

FIGS. 1A-1C illustrate an assembly of chips according to the prior art whereby a solder material 23 is formed on conductive pads or pillars 22 arranged on an active surface of a chip or component C, which is assembled onto the conductive pillars 32 of another chip or component C' (FIGS. 1A and 1B).

A dielectric material 40 is then formed between the components C, C' and around the conductive pillars that is called an underfill material which can be dispensed using a syringe and is distributed via capillarity (FIG. 1C). The chosen dielectric underfill material generally has adhesive properties ensuring the mechanical strength of the assembly.

The said method raises problems in terms of alignment of the components relative to each other. In addition, this method does not lend itself well to the assembling of chips or components having extensive interconnect density.

Document U.S. Pat. No. 9,018,758 discloses a method for assembling together two substrates whereby a Cu-based conductive pillar is placed in contact with a solder layer.

Document U.S. Pat. No. 8,461,679 presents a method for assembling together a chip and a substrate wherein the chip comprises a connection pillar on which a solder bump is formed to join the pillar onto a conductive pad of the substrate.

Document U.S. Pat. No. 7,291,548 B2 discloses a method for assembling a microelectronic device, formed of a chip on a substrate, with a board using solder balls surrounded by a stress-relief, polymer-containing layer.

Documents U.S. Pat. No. 7,473,998 B2, U.S. Pat. No. 6,578,755 B1, U.S. Pat. No. 8,138,426 B2 and U.S. Pat. No. 7,291,548 B2 describe a method for assembling together a substrate and a chip via solder balls formed on the chip, the balls being surrounded by a collar in polymer-containing material.

The problem is raised of improving on the formation of assembly structures for microelectronic devices.

DESCRIPTION OF THE INVENTION

The present invention firstly concerns a method for forming a first microelectronic device to be assembled with a second microelectronic device.

This method comprises the steps of:

a) forming, on the first microelectronic device, a stack comprising a conductive layer applied over a top surface of a conductive pad, and a protective dielectric layer comprising at least one opening called <<first opening>> facing the said pad and exposing the said conductive layer;

b) forming an insulating block on a peripheral region above the top surface of the said conductive pad, the said insulating block being obtained with a cross-section forming a closed contour and comprising an opening called <<second opening>> located in the centre of the said insulating lock and exposing the first opening;

c) forming a conductive pillar in said at least one first opening and second opening via growth from the said conductive layer.

The height of the conductive pillar and the height of the said insulating block previously formed at step b) are designed so that a void space or cavity is maintained between the top of the said conductive pillar and a mouth portion of the said second opening lying on a level with the top of the said insulating block.

With said method a conductive pillar is locally formed surrounded by a block of insulating material, this conductive pillar being intended to be assembled with a connecting element of another device.

By means of the insulating block, mechanical and electrically isolating protection is first obtained around the conductive pillar.

The void space or cavity is provided to house a conductive or connecting element of another device.

The insulating block therefore also forms means for the mechanical guiding of a connecting element of another microelectronic device which can be assembled onto the microelectronic device comprising the conductive pillar.

After step c), the method further comprises an etching step of said protective dielectric layer and conductive layer, using the insulating block as mask for this etching.

Therefore those portions of said protective dielectric layer and conductive layer that are removed are not protected by the insulating block.

By making provision so that this insulating block is formed at this step of the method it can be possible to avoid having to carry out an underfill operation after assembling the first device with another device.

According to one possible embodiment, the insulating block can be formed in a polymer material or mineral insulating material such as a ceramic material.

The cross-section of the insulating block may take on various forms e.g. a ring or polygonal contour, square in particular.

The growth of the conductive pillar can be of electrochemical type or of the type commonly known as electroless.

At step b), the second opening may expose a portion of the protective dielectric layer.

Thereby, when forming the conductive pillar, this can allow the imparting of a top surface thereto having a shape with one or more curves. Said non-planar shape of the top surface can facilitate the subsequent assembling of the conductive pillar with a connecting element.

According to one possible embodiment, the first opening made in the protective dielectric layer has a smaller diameter than the said second opening located in the centre of the insulating block and in the continuation of the said first opening.

This can afford the possibility of forming a conductive pillar of advantageous shape having a bump-shaped top.

According to another embodiment, the first opening is made on the periphery of a region of said stack overlying a central region of the said conductive pad.

This can make it possible to form a conductive pillar of advantageous shape having a top whose periphery forms a protuberance and whose centre is of concave shape.

Said shapes of the conductive pillar can facilitate the assembling thereof with a connecting element of another microelectronic device.

According to one possible embodiment, several first openings can be made in the protective dielectric layer facing one same conductive pad and in the vicinity of sidewalls of the said insulating block.

According to one possible embodiment, the second opening located in the centre of the said insulating block comprises walls lying at an angle to a normal to a main plane of the substrate.

The present invention also concerns a method for forming a structure in which the first microelectronic device is assembled with a second device, this method comprising the performing of steps of a method such as defined above, then joining the first microelectronic device with the said second microelectronic device by inserting in the said opening at least one connecting element of the second microelectronic device.

In this case, the void space or cavity can be occupied at least in part by the said connecting element of the second device.

After assembly, a portion of dielectric material can be formed around the said insulating block in a region located between the first microelectronic device and the second microelectronic device.

According to another aspect, the present invention concerns a microelectronic device comprising a substrate containing at least one conductive pad, the said pad being provided with a bottom surface resting on the substrate and an upper surface opposite the said bottom surface, the said upper surface of the said pad having applied thereto a stack formed by a conductive layer and a protective dielectric layer comprising a so-called <<first opening>> facing the said pad and exposing the said conductive layer, at least one insulating block being arranged on a peripheral region of the said upper surface of the said pad, the said insulating block having a cross-section forming a closed contour and comprising an opening called <<second opening>>, a conductive pillar being located in the centre of the said contour in the said second opening.

The height of the conductive pillar and the height of the said insulating block are designed relative to each other so that a void space or cavity is maintained between the top of the said conductive pillar and a mouth region of the said second opening located on a level with the top of the said insulating block.

The invention also concerns a structure comprising a microelectronic device such as defined above assembled with another device, so that a connecting element of the said other device is assembled onto the said conductive pillar and surrounded by the said insulating block. In this case the void space or cavity can then be occupied at least in part by the said connecting element of the second device.

BRIEF DESCRIPTION OF THE DRAWINGS

The present invention will be better understood on reading the description of examples of embodiment which are in no way limiting and given solely by way of indication with reference to the appended drawings in which.

Identical, similar or equivalent parts in the different Figures carry the same reference number to facilitate cross-reading between the Figures.

The different parts shown in the Figures are not necessarily drawn to uniform scale for better legibility thereof.

DETAILED DESCRIPTION OF PARTICULAR EMBODIMENTS

A method according to the invention will now be described in connection with FIGS. 2A-2F.

Figure 1A:
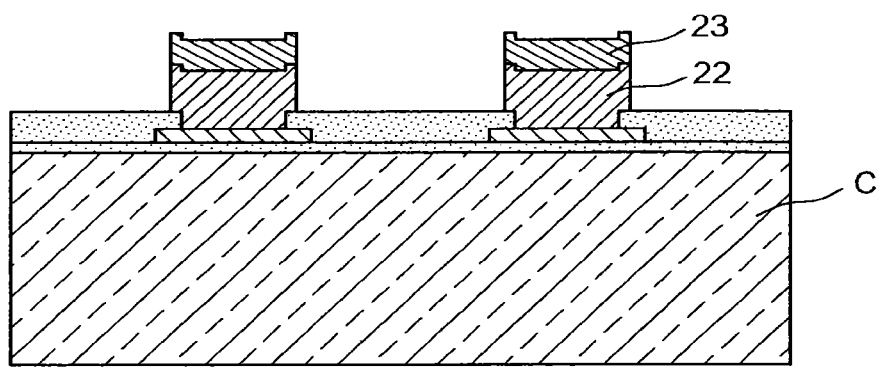
FIGS. 1A-1C illustrate one example of a prior art method for assembling components.
Figure 1A:
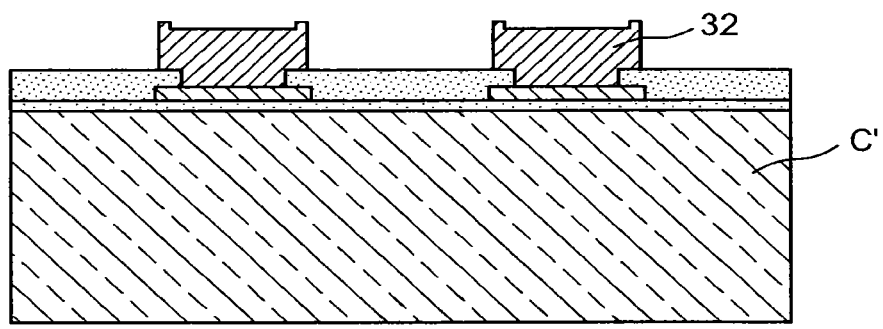
Figure 1B:
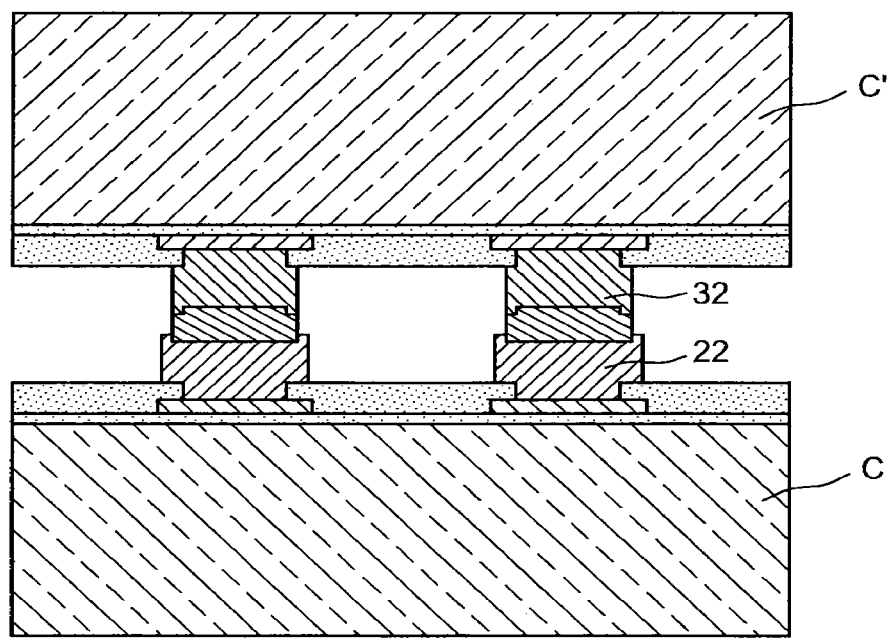
Figure 1C:
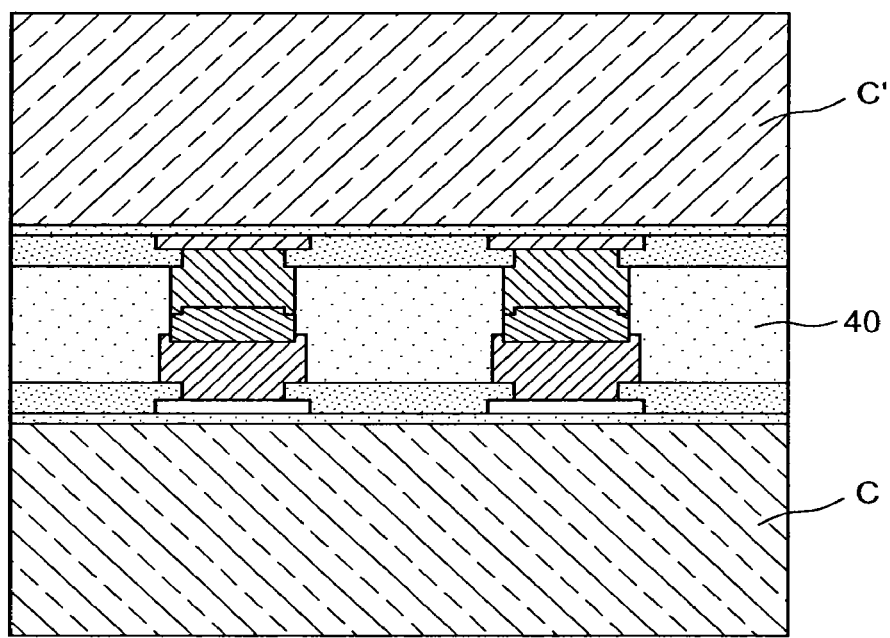
Figure 2:
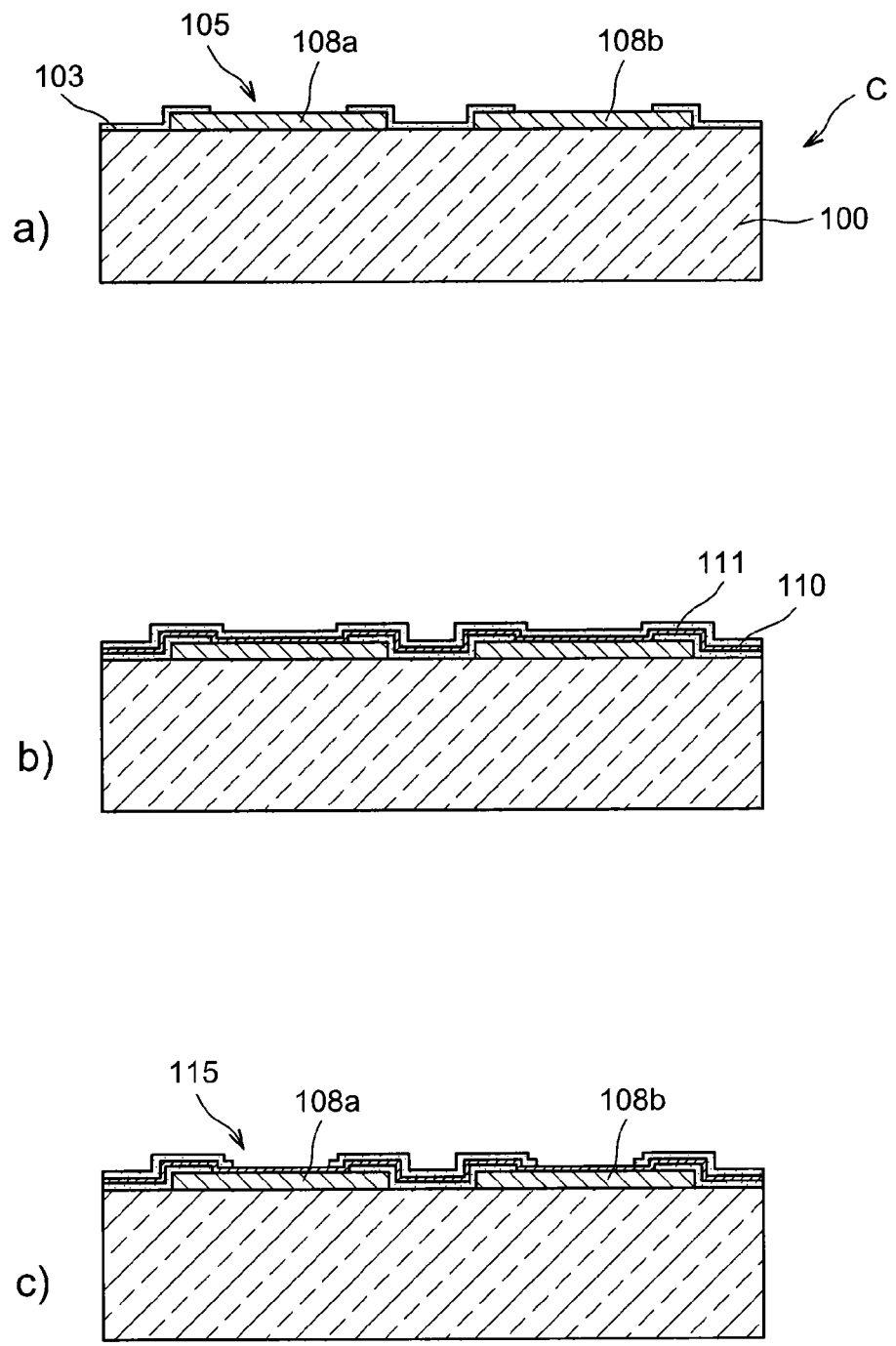
FIGS. 2A-2F illustrate one example of a method according to the invention for forming a microelectronic device provided with conductive pillars on a component and with means for isolating the conductive pillars allowing the assembling of this microelectronic device with another microelectronic device.
Figure 2:
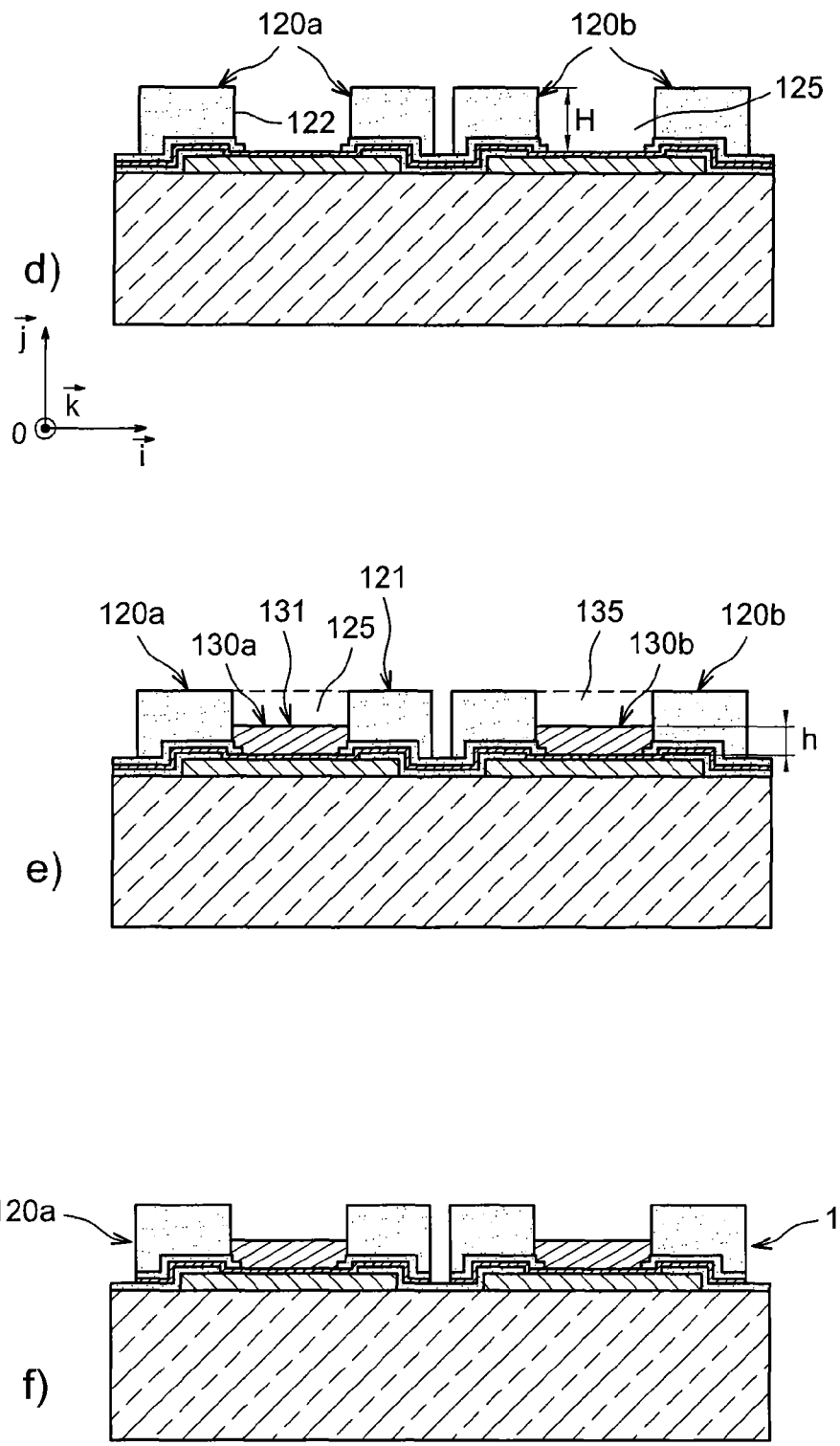

The starting material illustrated in FIG. 2A may be a chip for example or a given fabricated component C made from a semiconductor substrate 100 comprising conductive pads 108*a*, 108*b* e.g. in Al or Cu on its upper surface.

A dielectric layer 103 rests on the substrate 100 and on a peripheral region of the upper surface of the conductive pads 108*a*, 108*b*.

Openings 105 are made in this dielectric layer 103 and expose a central region of the upper surface of the conductive pads 108*a*, 108*b*, these conductive pads 108*a*, 108*b* thereby being partly encapsulated by the dielectric layer 103.

Next (FIG. 2B) a conductive layer 110 is formed and applied in particular to the conductive pads 108*a*, 108*b*, and particularly a central region of the upper surface of the conductive pads 108*a*, 108*b*.

This conductive layer 110 may be formed by a stack of several layers comprising an adhesion layer e.g. in Ti or TiW of thickness between 10 nm and 500 nm for example, and a Cu so-called <<nucleation>> layer possibly having a thickness of between 50 nm and 2 µm for example.

The conductive layer 110 may be obtained using a PVD technique for example (Physical Vapour Deposition).

A protective layer 111 is then formed applied in particular to the conductive layer 110.

The protective layer 111 may be in dielectric material and formed of a stack comprising a $Si_xN_y$-containing layer of thickness possibly ranging for example from 5 nm to 100 nm e.g. of the order of 40 nm, and a $SiO_2$ layer having a thickness for example of between 50 nm and 500 nm e.g. of the order of 500 nm.

To prevent degradation of the conductive layer 110, and the nucleation layer in particular, the depositing of the dielectric stack can be performed using a plasma enhanced chemical vapour deposition technique (PECVD) at low temperature e.g. lower than 400° C.

Openings 115 are then formed in the protective layer 111 to expose a region of the conductive layer 110 facing the conductive pads 108a, 108b, in particular at the central region of the upper surface of the pads 108a, 108b. These openings 115 can be made by etching for example via chemical and/or plasma route. If the protective layer is formed of a stack of $Si_3N_4$ and $SiO_2$, the $Si_3N_4$ layer can act as stop layer for etching of the $SiO_2$ layer (FIG. 2C).

Blocks 120a, 120b are then formed in dielectric material around the conductive pads 108a, 108b. The blocks 120a, 120b in dielectric material are also arranged on the peripheral region of the conductive pads 108a, 108b.

These blocks 120a, 120b have a cross-section (defined in FIG. 2D in a direction parallel to the plane [O; $\vec{i}$; $\vec{k}$] of the orthogonal reference [O; $\vec{i}$; $\vec{j}$; $\vec{k}$]) which forms a closed contour. The blocks 120a, 120b may be in the shape of a corona or ring or they may have a polygonal closed contour provided in its centre with an opening 125 exposing the central region of the upper surface of the conductive pads 108a, 108b.

The blocks 120a, 120b can be formed for example by spin coating or by laminating a polymer material e.g. an epoxy or silicon polymer material, or polyimide or BCB (benzocyclobutene) or polybenzoxazole (PBO).

This polymer material can be filled e.g. with $SiO_2$ beads.

The thickness or height H of the polymer blocks 120a, 120b (measured in FIG. 2D in a direction parallel to the vector $\vec{j}$ of the orthogonal reference [O; $\vec{i}$; $\vec{j}$; $\vec{k}$]) can be designed to be greater than the height of the conductive pillars which are to be subsequently formed, and may also depend on the height of the connecting elements of another component (not illustrated in FIG. 2D) intended to be assembled with the said given component C, the connecting elements of the said other component being intended to be inserted in an opening 125 located in the centre of the corona or ring and to bear upon conductive pillars 130a, 130b of the said given component.

The thickness of the blocks 120a, 120b may be between 3 μm and 500 μm for example. The closed contour-shaped pattern made in the polymer material to form the blocks 120a, 120b can be obtained by photolithography for example optionally using a hard mask (not illustrated in FIG. 2D).

In the centre of the corona or ring, the sidewalls 122 of the blocks 120a, 120b, called <<inner>> walls, are vertical in this example and arranged around the central region of the pads 120a, 120b.

Figure 5:
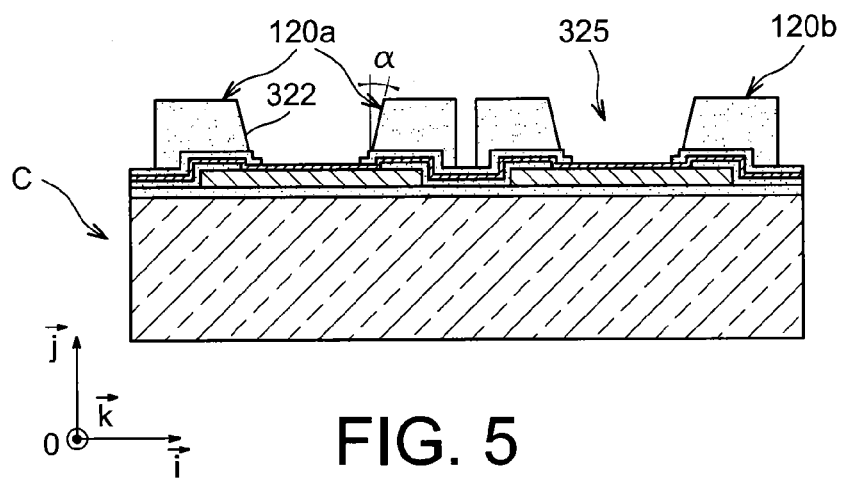
FIG. 5 illustrates an example of a particular embodiment of polymer blocks formed around conductive pillars of a microelectronic device, the said polymer blocks allowing the isolation of the conductive pillars and facilitating assembly with another microelectronic device.

According to one variant of embodiment illustrated in FIG. 5, inclined inner sidewalls 322 are provided which lie for example at an angle α of 60° or less relative to a normal $\vec{n}$ to the main plane of the substrate (defined in FIG. 5 as being a plane passing through the substrate and parallel to the plane [O; $\vec{i}$; $\vec{k}$] of the orthogonal reference [O; $\vec{i}$; $\vec{j}$; $\vec{k}$]) so that an opening 325 in the centre of the ring has an opening of flattened cone shape. With this configuration it is possible to facilitate subsequent assembling of the component C with another component and the insertion of connecting elements of the other component in the opening 325.

Heat treatment, at a temperature of between 60° C. and 250° C. for example can be conducted to modify the properties of the polymer and impart greater hardness thereto.

In the centre of the closed contour formed by each of the blocks 120a, 120b, the inner sidewalls 122 of these blocks 120a, 120b define openings 125 in which conductive pillars 130a, 130b are subsequently formed (FIG. 2E). Therefore, the conductive pillars 130a, 130b are made on the conductive pads 108a, 108b and surrounded by polymer material. The conductive pillars 130a, 130b can be formed by depositing metal material via electrolysis on the regions of the nucleation layer 110 exposed by the openings 115 made in the protective dielectric layer 111.

The conductive pillars 130a, 130b can be copper-based and may be coated with a protective layer against oxidation, e.g. formed of a three-layer stack of Ti, Ni and Au (FIG. 2E).

The conductive pillars 130a, 130b have a height h (measured in FIG. 2E in a direction parallel to the vector $\vec{j}$ of the orthogonal reference [O; $\vec{i}$; $\vec{j}$; $\vec{k}$]) of between 1 μm and 500 μm for example, designed to be less than the thickness of the blocks 120a, 120b.

Exposed portions of the protective dielectric layer 111 and then of the conductive layer 110, that are not covered by the polymer blocks 120a, 120b, are then removed. The blocks 120a, 120b therefore act as etching mask.

The etching of the layers 111 and 110 can be performed using chemical attack solutions for example, or etching solutions of reactive plasma type having high selectivity for the blocks 120a, 120b.

The etching of the protective dielectric layer 111 can be conducted using a dilute hydrofluoric acid solution or using $O_2/CF_4$ plasma in particular to etch a $SiO_2$ dielectric layer 111.

The subsequent etching of the conductive layer 110 can be performed using chemical attack solutions of the metal layer or layers forming this conductive layer, or by etching with reactive plasma. For example, to etch a copper-based conductive layer 110 it is possible to use a solution of sulfuric or orthophosphoric acid.

The method may then optionally comprise a step to deoxidise the pillars 130a, 130b, especially if these are formed of copper.

Figure 3:
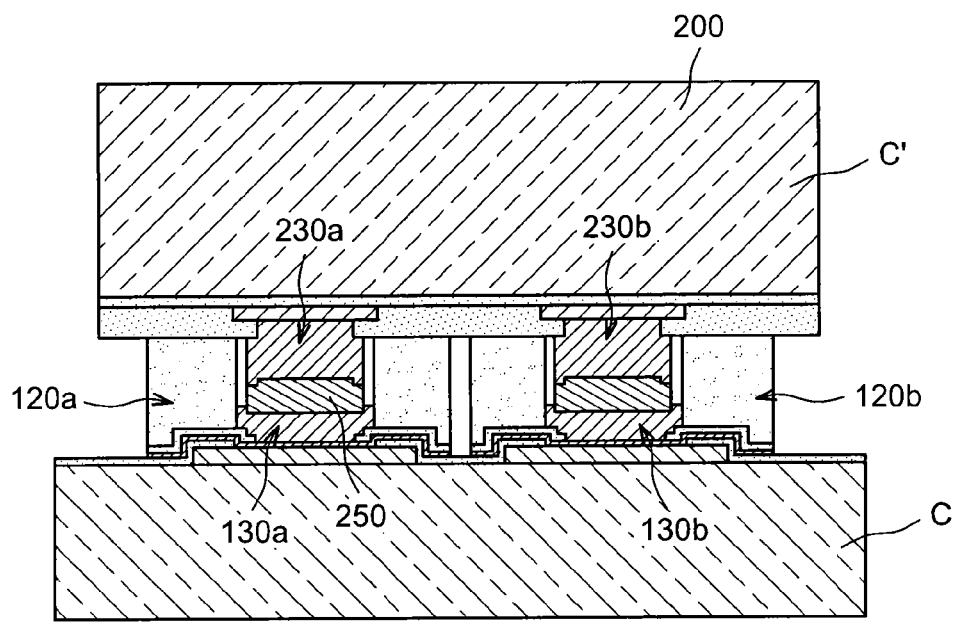
FIGS. 3 and 4 illustrate an assembly of a microelectronic device formed according to a method such as illustrated in FIGS. 2A-2F with another microelectronic device.

The assembling of the given component C with another component C' provided with connecting elements 230a, 230b, e.g. copper-based is illustrated in FIG. 3.

This assembling can be obtained by adding on the connecting elements 230a, 230b which are first inserted in the opening 125 then assembled onto the conductive pillars 130a, 130b, via a metal-containing solder material 250 preferably fusible at low temperature such as lead, tin or a tin and silver alloy.

At the time of insertion, the polymer blocks 120a, 120b acts as guiding means for the connecting elements 230a, 230b of the component.

During the solder operation, the polymer material passes through a soft phase promoting the contacting of the contact elements against the conductive pillars 130a, 130b. The polymer then passes through a cross-linking phase during which it becomes hardened.

Assembling can be achieved using equipment of pick and place type.

According to one possible embodiment for joining, a viscous liquid such has a solder flux can be deposited on the solder material to facilitate the forming of a metal region joining together the conductive pillars 130a, 130b and the connecting elements 230a, 230b.

Deoxidising treatment of the connecting elements 230a, 230b can optionally be subsequently carried out.

On completion of assembly, the inner walls 122 of the blocks 120a, 120b in polymer material and the respective carriers of the given component C and of the said other component C' may form a closed enclosure around the assembly of the connecting elements 230a, 230b and of the conductive pillars 130a, 130b. This makes it possible to protect and electrically isolate the conductive pillars 130a, 130b and the connecting elements 230a, 230b.

Figure 4:
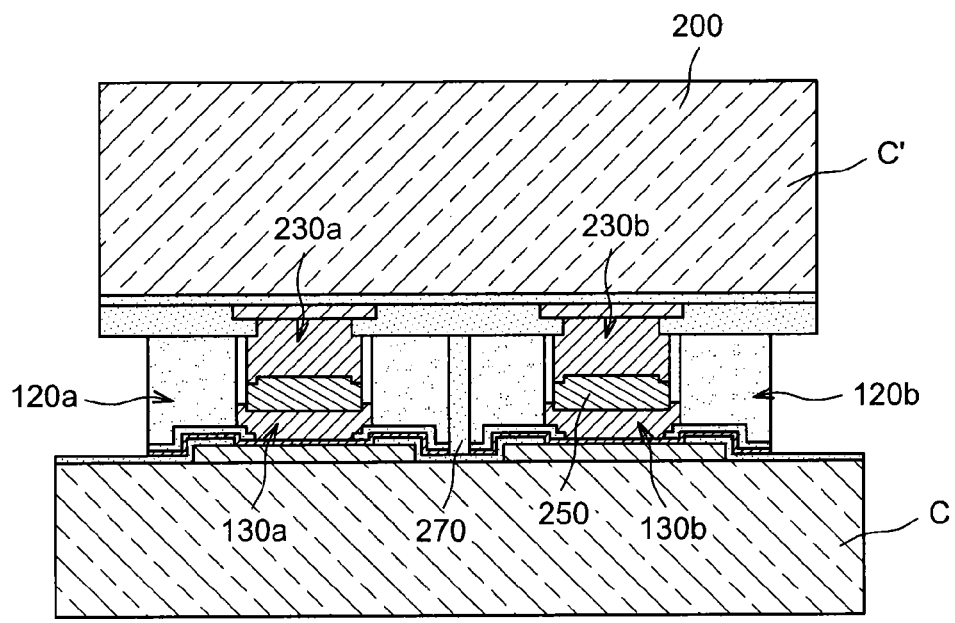

If the dimensions of the blocks (FIG. 3) 120a, 120b are such that a void 260 exists therebetween, it is possible to fill this void space 260 e.g. with a dielectric material 270 which may be a polymer for example (FIG. 4).

The method just described is not necessarily limited to fabrication starting from a component C whose fabrication is completed, but may also be applied for example to assembling onto a board, a substrate or interposer.

Figure 6A:
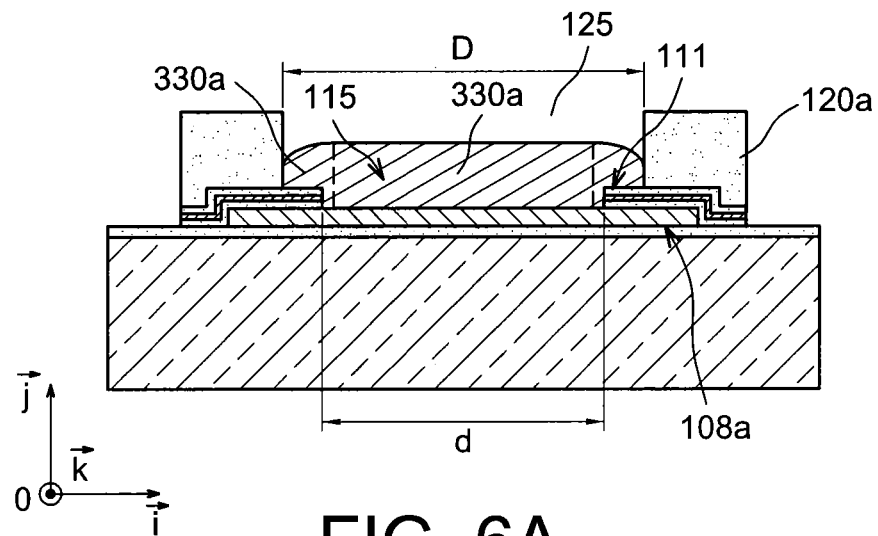
FIGS. 6A-6B illustrate a microelectronic device provided with a polymer block allowing insulation to be obtained around a conductive pillar, the pillar having a bump-shaped top intended to be assembled with another connecting element of another microelectronic device.
Figure 6B:
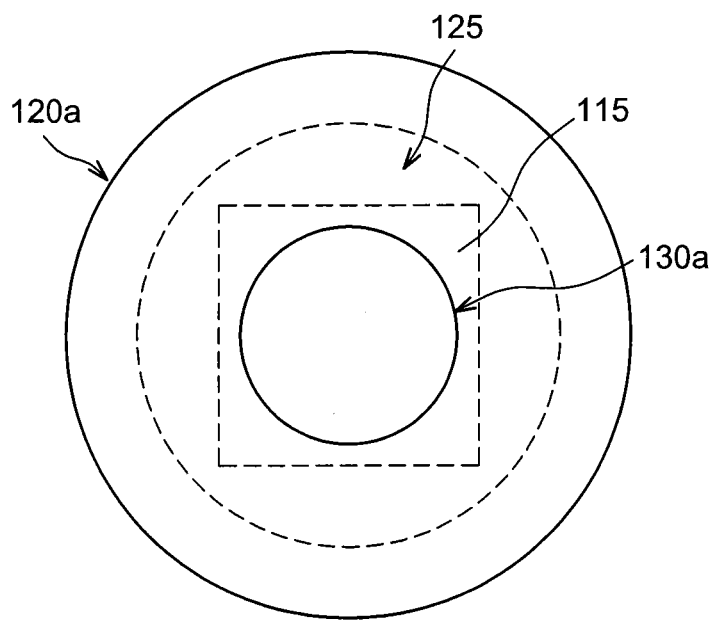

In FIGS. 6A-6B, a variant of embodiment of a conductive pillar 330a is illustrated (from an overhead view and cross-sectional view respectively).

The insulating block 120a around the conductive pillar 330a is formed so that the opening 125 provided in its centre exposes a portion of the protective dielectric layer.

For this variant, the opening 125 located in the centre of the ring formed by the insulating block is provided with a diameter D greater than the diameter of the opening 115 made in the protective dielectric layer 111 (these diameters being measured in a direction parallel to the plane $[O; \vec{i}; \vec{k}]$ of the orthogonal reference $([O; \vec{i}; \vec{j}; \vec{k}])$.

This makes it possible to impart a convex or bumped shape to the top of the conductive pillar 330a. Said shape may be advantageous when soldering and assembling with a connecting element of another component.

Figure 7A:
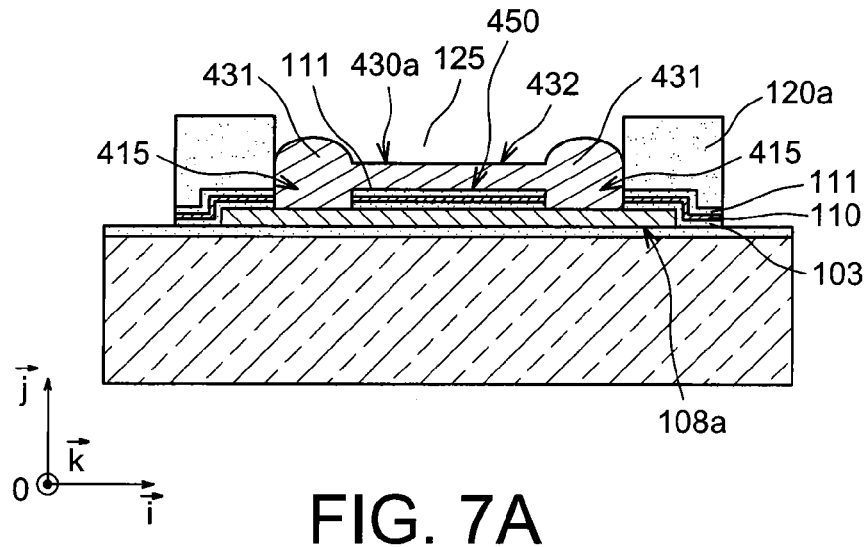
FIGS. 7A-7B illustrate a microelectronic device provided with a polymer block allowing insulation to be obtained around a conductive pillar which has a rimmed shape around the periphery of its top surface, the conductive pillar being intended to be assembled with another connecting element of another microelectronic device.
Figure 7B:
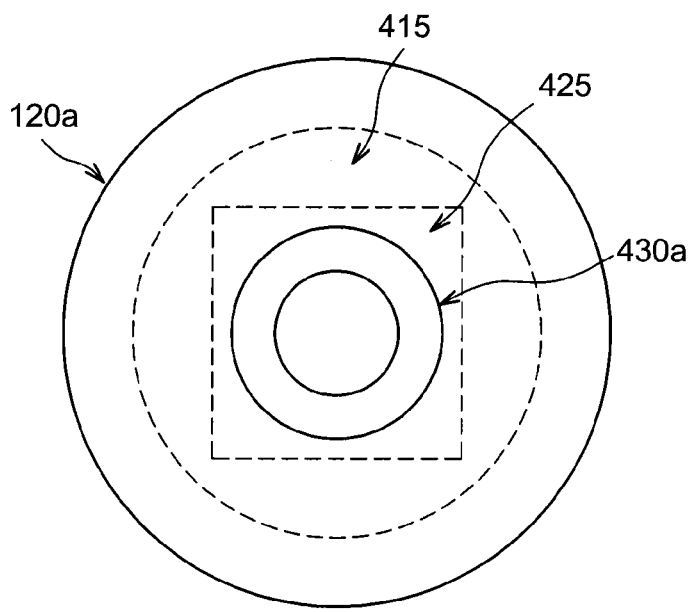

In FIGS. 7A-7B, a variant of embodiment of conductive pillar 430a is illustrated (from an overhead view and cross-sectional view respectively).

For this variant, an opening 415 in trench form forming a closed contour is made in the stack formed by the protective dielectric layer 111, the conductive layer 110 and the dielectric layer 103, The opening 415 is placed in a region of the upper surface of the conductive pad 108a positioned around a portion 450 of the stack of layers 111, 110 and 103 maintained on the pad 108a.

Through the arrangement of this opening 415 which exposes a portion of the protective dielectric layer 111, the electrolytic growth of metal material leads to the formation of a conductive pillar 330a having a rim or protuberance 431 on the periphery of its top side, the conductive pillar 430a thereby having a convex part 432 in a central region of its top side. Said shape of the conductive pillar 430a may facilitate assembling with a connecting element of another component which is inserted in the opening 125 in the centre of the ring.

The invention claimed is:

1. A method for forming a first microelectronic device to be assembled with a second microelectronic device, the method comprising the steps of:
    forming, on the first microelectronic device comprising at least one conductive pad, said pad having a bottom surface resting on a substrate and an upper surface opposite said bottom surface, a conductive layer applied over said pad;
    forming a protective dielectric layer over said conductive layer, the protective dielectric layer comprising at least one first opening facing said pad and exposing said conductive layer;
    forming, on a peripheral region above the upper surface of said conductive pad, an insulating block, said insulating block being provided with a cross-section forming a closed contour and comprising a second opening located inside said insulating block and exposing at least part of the first opening in the protective dielectric layer;
    forming, in said at least one first opening and said second opening, a conductive pillar by growth from said conductive layer, the height of the conductive pillar and the height of said insulating block relative to each other being such that a void space or cavity is maintained between the top of said conductive pillar and a mouth region of said second opening lying on a level with the top of said insulating block, the protective dielectric layer being arranged outside said insulating block so that growth of said conductive pillar on said conductive layer is prevented outside said insulating block; and
    after said forming a conductive pillar, etching said protective dielectric layer and said conductor layer outside said closed contour of the insulating block using the insulating block and said conductive pillar as a protective mask for etching.

2. The method according to claim 1, the void space being formed so as to allow the inserting, in said second opening, at least one connecting element of a second microelectronic device intended to be assembled with said first microelectronic device.

3. The method according to claim 1 wherein the first opening made in the protective dielectric layer has a smaller diameter than the diameter of said second opening located inside the insulating block and exposing said first opening.

4. The method according to claim 1 wherein the first opening is formed on a central part of said conductive pad such that the protective layer is provided on a periphery of said conductive pad.

5. The method according to claim 1 wherein said second opening located in the center of said insulating block has walls lying at an angle offset from a normal to a main plane of the substrate.

6. A method for producing a structure formed of the first microelectronic device of claim 1 on which a second device is assembled, comprising:
    forming the first microelectronic device by the implementation of a method according to claim 1; joining of the second microelectronic device onto said first microelectronic device by inserting in said second opening at least one connecting element of the second microelectronic device; and
    assembling said connecting element onto said conductive pillar of said first microelectronic device.

7. The method according to claim 6 further comprising, after said assembling, forming dielectric material around said insulating block in a region located between the first microelectronic device and the second microelectronic device.

8. The method according to claim 1 wherein several first openings, including said first opening, are made in the protective dielectric layer facing one same conductive pad and in the vicinity of sidewalls of said insulating block.

9. The method according to claim 6, wherein said second microelectronic device comprises a substrate and wherein said assembling of said first microelectronic device and said second microelectronic device is such that inner walls of said insulating block and the respective substrates of the first and second microelectronic device form a closed enclosure around the assembly of said connecting element and said conductive pillar.

* * * * *